United States Patent
Brundage et al.

(10) Patent No.: US 10,930,514 B2
(45) Date of Patent: Feb. 23, 2021

(54) METHOD AND APPARATUS FOR THE PLANARIZATION OF SURFACES

(71) Applicant: FEI Company, Hillsboro, OR (US)

(72) Inventors: Philip Brundage, Portland, OR (US);
Zachary Klassen, Hillsboro, OR (US);
Chad Rue, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/004,939

(22) Filed: Jun. 11, 2018

(65) Prior Publication Data

US 2019/0378689 A1    Dec. 12, 2019

(51) Int. Cl.
| | | |
|---|---|---|
| *H01L 21/306* | (2006.01) | |
| *H01L 21/3065* | (2006.01) | |
| *H01J 37/305* | (2006.01) | |
| *C23F 4/00* | (2006.01) | |
| *H01J 37/20* | (2006.01) | |

(52) U.S. Cl.
CPC ............ *H01L 21/3065* (2013.01); *C23F 4/00* (2013.01); *H01J 37/3056* (2013.01); *H01J 37/20* (2013.01); *H01J 2237/20228* (2013.01); *H01J 2237/3174* (2013.01)

(58) Field of Classification Search
None
See application file for complete search history.

(56) References Cited

U.S. PATENT DOCUMENTS

| | | | |
|---|---|---|---|
| 2015/0056815 A1* | 2/2015 | Fernandez | ........ H01L 21/31056 438/712 |
| 2015/0255243 A1* | 9/2015 | Godet | ............... H01J 37/32091 216/38 |
| 2017/0069526 A1* | 3/2017 | Park | .................. H01L 21/68764 |

* cited by examiner

*Primary Examiner* — Duy Vu N Deo

(57) ABSTRACT

Techniques for planarizing surfaces are disclosed herein. One example includes orienting a surface of a sample to a charged particle beam axis, the sample including a first layer formed from first and second materials, the first material patterned into a plurality of parallel lines and disposed in the second material, where the surface is oriented to form a shallow angle with the charged particle beam axis and to arrange the plurality of parallel lines perpendicular to the charged particle beam axis, providing a charged particle beam toward the surface, providing a gas to the surface, and selectively etching, with ion induced chemical etching, the second material at least down to a top surface of the first material, the charged particle induced etching stimulated due to concurrent presence of the charged particle beam and the gas over the surface of the sample.

20 Claims, 6 Drawing Sheets

METHOD AND APPARATUS FOR THE PLANARIZATION OF SURFACES

FIELD OF THE INVENTION

This disclosure is generally directed to charged particle beam assisted etching, and more specifically toward ion beam assisted planarization.

BACKGROUND OF THE INVENTION

Physical analysis of small semiconductor samples, which are typically taken from wafers or chips, conventionally requires de-processing areas of the wafer or chips to uncover a desired area for analysis. As semiconductor processing technology has evolved, the deprocessing has become more complex due to multiple layers and materials included in the wafers/chips. The feature size of the circuitry has also shrunk, which puts its own constraints on the deprocessing. Due to the various layers and the size of the circuitry, removing upper layers to expose desired locations, which may include a defect, has become more complicated. While circuitry of older technology was larger and required less control on the deprocessing, the newer technology requires finer fidelity to uncover desired areas without affecting those areas during the deprocessing. One aspect of this requires planar surfaces that help remove layers uniformly and provide some process control. While previous planarization processes worked for larger features, their use with smaller features is less than desirable. As such, a planarization technique for use with smaller feature sizes is desirable.

SUMMARY

Techniques for planarizing surfaces are disclosed herein. One example includes orienting a surface of a sample to a charged particle beam axis, the sample including a first layer formed from first and second materials, the first material patterned into a plurality of parallel lines and disposed in the second material, where the surface is oriented to form a shallow angle with the charged particle beam axis and to arrange the plurality of parallel lines perpendicular to the charged particle beam axis, providing a charged particle beam toward the surface, providing a gas to the surface, and selectively etching, with ion induced chemical etching, the second material at least down to a top surface of the first material, the charged particle induced etching stimulated due to concurrent presence of the charged particle beam and the gas over the surface of the sample.

BRIEF DESCRIPTION OF THE DRAWINGS

Like reference numerals refer to corresponding parts throughout the several views of the drawings.

DETAILED DESCRIPTION OF EMBODIMENTS

Figure 1:
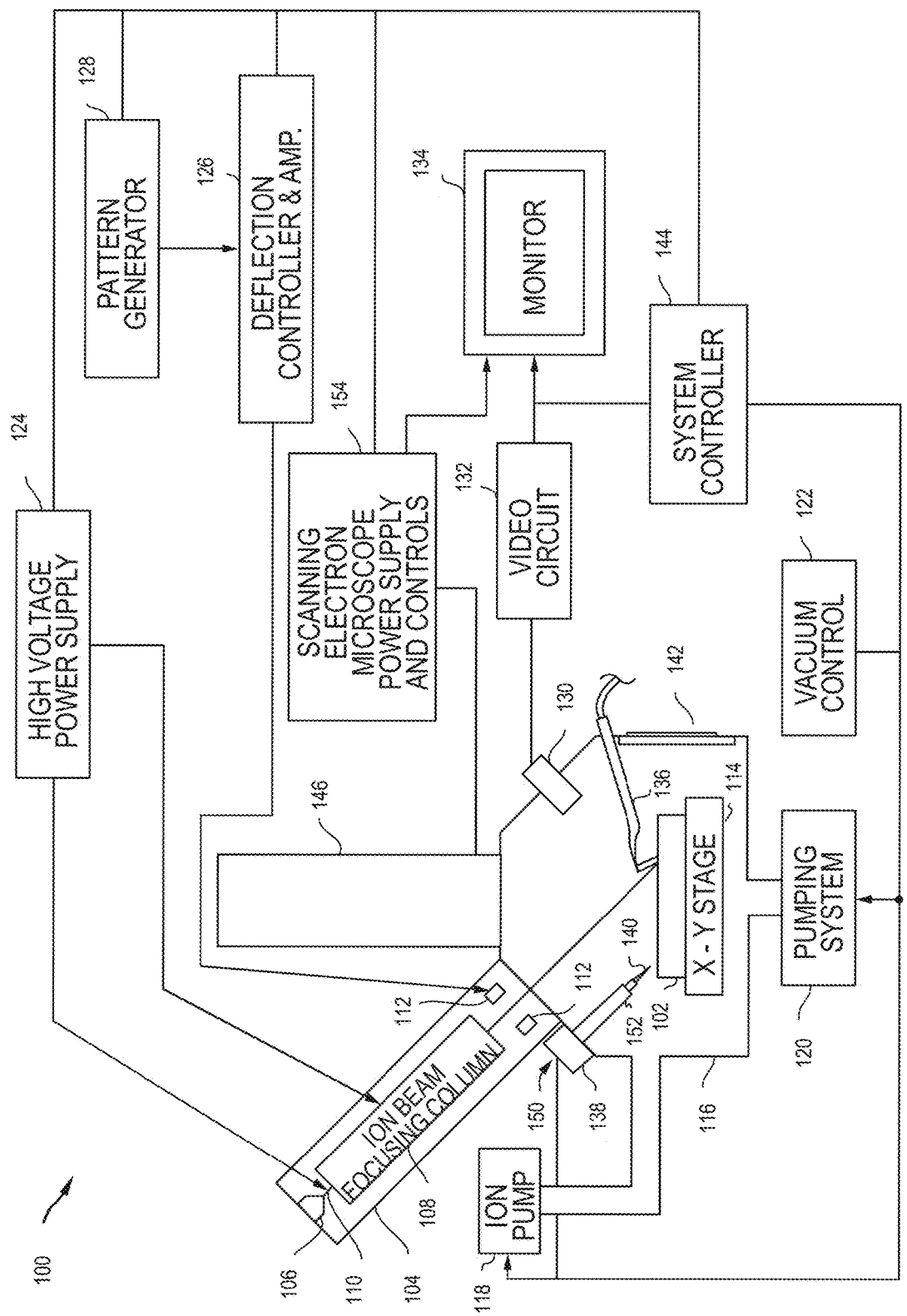
FIG. 1 illustrates a charged particle system in accordance with an embodiment of the present disclosure.

Embodiments of the present invention relate to planarizing samples comprising various materials that do not etch and/or mill at similar rates. The planarization process disclosed uses features of a first material to mask milling of a second due to the angle between a charged particle beam and the sample surface. As such, a planar surface is formed at a top level of the first material. In some examples, the first material is a metal formed into parallel lines and the second material is a dielectric. A process gas is provided to stimulate ion induced etching of the dielectric while the metal lines act as shadow masks to the charged particle beam to reduce or prevent milling of the dielectric. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Additionally, in the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, separated from a wafer, or packaged for use on a circuit board. The term "FIB" or "focused ion beam" is used herein to refer to any collimated ion beam, including a beam focused by ion optics and shaped ion beams.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

FIG. 1 illustrates a charged particle system 100 in accordance with an embodiment of the present disclosure. The system 100 may be a focused ion beam (FIB) system or a dual beam system. However, in either system, an electron microscope may be included for imaging and inspection of a loaded sample, and an ion beam system is included for processing and/or imaging the loaded sample. The FIB portion of the system 100 at least includes an evacuated envelope having an upper neck portion 104 within which is housed the ion beam aspects of the system 100. The ion beam aspects may at least include a source 106, such as a liquid metal or plasma ion source, and a focusing column 108. Other types of ion sources, such as multicusp or other plasma sources, and other optical columns, such as shaped beam columns, could also be included.

An ion beam 110 passes from liquid metal ion source 106 through ion beam focusing column 108 and between electrostatic deflection plates 112 toward sample 102. The sample 102 may be a semiconductor wafer or piece of wafer on stage 114 within lower chamber 116. In some embodiments, stage 114 can additionally support one or more transmission electron microscope (TEM) sample holders, so that a TEM lamella can be extracted from the sample and moved to a TEM sample holder, if so desired. Stage 114 can move in a horizontal plane (X and Y axes) and vertically (Z axis), and may also be able tilt approximately +/− sixty (60) degrees and rotate about the Z axis. System controller 144 controls the operations of the various parts of the system 100, such as the electron microscope portion and the FIB portion. Through system controller 144, a user can control ion beam 110 to be scanned in a desired manner through commands entered into a conventional user interface (not shown). Alternatively, system controller 144 may control the FIB portion of the system 100 in accordance with programmed instructions stored in a computer readable memory, such as a RAM, ROM, or magnetic or optical disk. The memory can store instructions for carrying out the methods described above in an automated or semi-automated manner. Images from the SEM can be used to decide when to continue processing, when to stop processing, and when the sample 102 is planar at a desired layer.

An ion pump 118 is employed for evacuating upper neck portion 104. The lower chamber 116 is evacuated with turbo molecular and mechanical pumping system 120 under the control of vacuum controller 122. The vacuum system provides within lower chamber 116 a vacuum of between approximately 1×10-7 Torr (1.3×10-7 mbar) and 5×10-4 Torr (6.7×10-4 mbar). If an etch-assisting gas, an etch-retarding gas, or a deposition precursor gas is used, the chamber background pressure may rise, typically to about 1×10-5 Torr (1.3×10-5 mbar).

High voltage power supply 124 is connected to ion source 106 as well as to appropriate electrodes in ion beam focusing column 108 for forming an approximately 0.5 keV to 60 keV ion beam 110 and directing the same toward a sample.

Deflection controller and amplifier 126, operated in accordance with a prescribed pattern provided by pattern generator 128, is coupled to deflection plates 112 whereby ion beam 110 may be controlled manually or automatically to trace out a corresponding pattern on the upper surface of sample 102. In some embodiments, the deflection plates are placed before the final lens, as is well known in the art. Beam blanking electrodes (no shown) within ion beam focusing column 108 cause ion beam 110 to impact onto blanking aperture (not shown) instead of sample 102 when a blanking controller (not shown) applies a blanking voltage to the blanking electrode.

The ion source 106 typically provides an ion beam of ions, the type of ions dependent upon the type of ion source 106. The source typically is capable of being focused into a sub one-tenth micrometer wide beam at sample 102 for either modifying the sample 102 by ion milling, enhanced etch, material deposition, or for the purpose of imaging the sample 102. A charged particle detector 130, such as an Everhart Thornley or multi-channel plate, used for detecting secondary ion or electron emission is connected to a video circuit 132 that supplies drive signals to video monitor 134 and receiving deflection signals from controller 144.

The location of charged particle detector 130 within lower chamber 116 can vary in different embodiments. For example, a charged particle detector 130 can be coaxial with the ion beam and include a hole for allowing the ion beam to pass. In other embodiments, secondary particles can be collected through a final lens and then diverted off axis for collection. The scanning electron microscope SEM 146, along with its power supply and controls 154, are optionally provided with the system 100.

A gas injection system (GIS) 136 extends into lower chamber 116 for introducing and directing a gaseous vapor toward sample 102. For example, xenon difluoride can be delivered to enhance etching, or a metal organic compound can be delivered to deposit a metal. Other than xenon difluoride, other possible gases include chlorine, iodine, bromine, nitrous oxide, oxygen, water, fluorine, trifluoroacetate acid, trifluoroacetamide, methyl nitro acetate, acetic anhydride, and combinations thereof. The selection of gas for processing any given sample 102 may depend on material or materials that form the sample and further determined by a desire to selectively etch one material over another material. For example, if a layer on the sample 102 includes copper lines encased in a dielectric and it is desired to etch the dielectric over the copper, then xenon difluoride may be provided by GIS 136. Of course, other combinations of materials may result in one or more different gases being provided by GIS 136.

A micromanipulator 150, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 150 may comprise precision electric motors 138 positioned outside the vacuum chamber to provide X, Y, Z, and theta control of a portion 152 positioned within the vacuum chamber. The micromanipulator 150 can be fitted with different end effectors for manipulating small objects. In the embodiments described below, the end effector is a thin probe 140 that may be electrically connected to system controller 144 to apply an electric charge to the probe 140 to control the attraction between a sample and the probe.

A door 142 is opened for inserting sample 102 onto X-Y stage 114, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam focusing column focusing 108 for energizing and focusing ion beam 110. When it strikes sample 102, material is sputtered, that is physically ejected, from the sample. Alternatively, ion beam 110 can decompose a precursor gas to deposit a material. While an example of suitable hardware is provided above, the techniques disclosed herein are not limited to being implemented in any particular type of hardware.

The system 100 may be capable of processing various samples, such as semiconductor wafers and/or integrated circuits (ICs). The techniques disclosed herein may be implemented in the system 100 for the planarization of desired areas of a wafer and/or an IC. Additionally, the techniques disclosed herein may be used to planarize lamella for us in a transmission electron microscope (TEM). In either use case, it may be desirable to process the sample to form a planar surface, planar at least with respect to underlying structure of the wafer/IC, or to an opposite side for the lamella. For example, modern semiconductor wafers include active circuitry formed on or in a thin layer of a substrate, and the circuitry is interconnected using several layers of metal lines/traces. In some embodiments, there may be up to seven layers of interconnects and associated vias. In some embodiments, the upper interconnect layers may have thicker metal lines than lower interconnect layers. The thicker metal lines, in some embodiments, may be a hindrance to maintaining a planar structure when etching down to the lower layers, e.g., the circuitry. However, the techniques disclosed herein allows for implementing a planarizing process as the various layers are removed. Maintaining planarization may prevent over etching a desired layer so that areas designated for further study are not inadvertently removed.

In some embodiments, the planarization techniques disclosed herein include orienting the sample 102 at a shallow/glancing angle to the ion beam while providing one or more process gases through GIS 136. Additionally, as noted, interconnect lines in the sample may be used as shadow masks to the ion beam by orienting the metal lines to be perpendicular to the ion beam. As such, the combination of the shallow angle and the perpendicular metal line shadow masks, material above the metal lines may be chemically etched through ion induced etching while material below and laterally adjacent to the metal lines experiences limited ion-induced etching due to the metal line shadow masks. During the etching process, the ion beam will be rastered over an area of the sample 102 to be planarized so that chemically-assisted etching is initiated, but the dwell time may be short. A short dwell time may also reduce mechanical milling/ablation and promote chemical etching, whereas a long dwell time may consume all the gas present and mechanical milling may begin. The ion beam may be provided at low energy and at a low beam current density, which provides a set of conditions to stimulate chemical etching over mechanical ablation/milling.

As such, the technique establishes as set of parameters—glancing angle, selective process gas, ion beam energy, beam current density—that promotes selective etching of a dielectric over a metal and the arrangement of the metal lines formed from the metal provides the shadow mask to further reduce milling of the dielectric from between the metal lines. Some milling of the dielectric over the metal lines is tolerable. However, as the dielectric is etched down to a level even with a top surface of the metal lines, the ion beam can be disabled so that a planar surface even with the metal lines is obtained.

The shallow/glancing angle may be determined by a distance between the metal lines, which may be an inverse relationship. For example, metal lines that are far apart may necessitate a shallower angle than metal lines that are closer together.

It should be recognized that embodiments of the present disclosure can be implemented via computer hardware or software of the system 100, or a combination of both. The methods can be implemented in computer programs using standard programming techniques-including a computer-readable storage medium configured with a computer program, where the storage medium so configured causes a computer to operate the system 100 in a specific and predefined manner-according to the methods and figures described herein. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein. Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to process a sample 102 using a beam of charged particles. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The techniques disclosed herein have broad applicability and can provide many benefits as described and shown in the discussed embodiments. The embodiments will vary greatly depending upon the specific application, and not every embodiment will provide all of the benefits and meet all of the objectives that are achievable by the invention. However, even though much of the previous description is directed toward the use of FIB milling and imaging, the beam used to process the desired samples could comprise, for example, an electron beam, a laser beam, or a focused or shaped ion beam, for example, from a liquid metal ion source or a plasma ion source, or any other charged particle beam. Further, although much of the previous description is directed at particle beam systems, the invention could be applied to any suitable sample imaging system employing a moveable sample stage to navigate to the location of a sample feature.

When the positional error or accuracy of the system stage or of beam placement or navigation is discussed herein, the terms ±100 nm (or ±30 nm or ±X nm) mean that the beam can be directed at a location on the sample within a maximum error of 100 nm (or 30 nm or x nm). The terms "accuracy of ±X nm" or "positioning accuracy of X nm or better" means that the accuracy is at least X nm and includes all smaller values. The term "accuracy of X nm or greater" means that the accuracy is at best X nm and includes all larger values.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Figure 2:
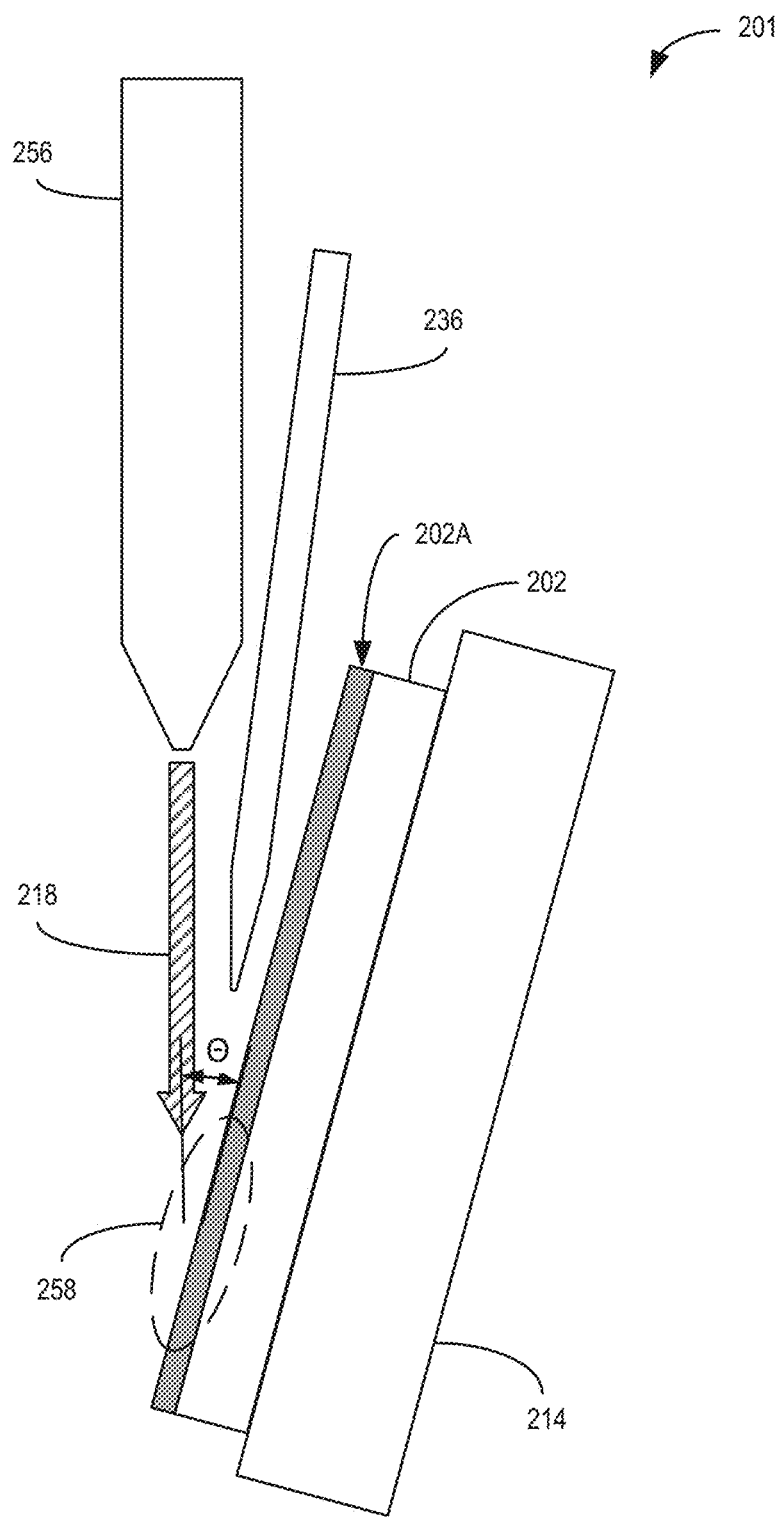
FIG. 2 is an example configuration for planarizing a sample in accordance with an embodiment of the present disclosure.

FIG. 2 is an example configuration 201 for planarizing a sample in accordance with an embodiment of the present disclosure. The configuration 201, which may be implemented in a charged particle system, such as system 100, illustrates a relative orientation of a sample 202 to an ion beam 218. The configuration 201 illustrates the relative angle Θ between sample 202 and an ion beam 218 that allows for planarizing a region of interest of the sample 202. To illustrate the configuration, the sample 202, the ion beam 218, a stage 214, and gas injection system (GIS) 236 are illustrated in FIG. 2, which would be located in a chamber of a charged particle beam system, such as the system 100. The remaining elements of the charged particle system are omitted to not clutter the figure.

The stage 214 may orient the sample 202 to a desired angle Θ with the ion beam 218 based on the configuration 201. In some embodiments, the angle Θ may be a shallow or glancing angle. For example, angle Θ may be in the range of 1° to 20°. The degree of the angle Θ, however, may be adjusted based on at least one feature of an active layer of the sample 202. As used herein, "active layer' includes at least one layer of circuit elements, e.g., transistors, resistors, capacitors, etc., and one or more layers that include interconnections, e.g., conductive traces. For example, the active layer 202A may include one layer of circuit elements and up to 8 different layers of interconnections disposed thereon including connecting vias. In some embodiments, the different layers of interconnections may be formed from the conductive traces and are separated by and encapsulated in one or more dielectric materials. Additionally, the conductive traces of each interconnection layer may be of different heights, widths, and separated by different spacing. In some embodiments, the height, width and/or spacing may affect the angle Θ.

While the present embodiment is described as being implemented on a stage that is tilted to obtain the shallow/glancing angle-of-incidence disclosed, in other embodiments, a tilted wedge that is mounted on the stage 214 may provide a mounting platform for the sample 202. In such an embodiment, the stage 218 may not need to tilt as much or at all to obtain the desired shallow angle due to mounting the sample 202 on the tilted wedge. The tilted wedge configured to have mounting surfaces that provide the desired glancing angle with respect to the ion beam 218.

The ion beam 218 is provided by ion column 256, which may include the FIB portions of system 100, such as the ion source 106, ion beam focusing column 108, and deflector plates 112 arranged inside vacuum envelope 104. The ion beam may be provided over a range of energies, which may be from 0.5 keV to 30 keV. Of course, energies other than the listed range are possible and contemplated herein. In some embodiments, however, it may be desirable to provide the ion beam 218 at low energies to reduce or limit mechanical milling of a desired material and to preferentially induce chemical etching in the desired material instead. For example, the ion beam 218 may be provided at energies from 500 eV to 12 keV. In addition to the energy of the ion beam 218, a source current used to generate the ion beam may also be adjusted based on various factors of the planarization technique. For example, the planarization technique may desirably be performed using a low beam current pattern density, such as in a range from 0.1 pA/μm² to 1 pA/μm². The unit pA/μm² is picoAmpere per square micron. The beam current may be dependent on the size of an area to be planarized, e.g., a planarization area 258, along with other factors such as dwell time of the ion beam 218, ion beam overlap, and refresh times. As such, a larger planarization area 258 may lead to a higher absolute source current to provide a pattern beam current density in the example range. Of course, pattern beam current densities outside of the example range are also possible and contemplated herein. In general, the ion beam 218 may be provided based on the following conditions: beam current density ideally 1-2 pA/um², not to exceed about 50 pA/um², dwell times of 100 nsec, beam overlap of approximately 0%, and refresh times, if desired, on the order of 1-5 msec.

The etching may be induced by flowing in one or more process gases through GIS 236. In some embodiments, the process gas may be provided as close to the planarizing area 258 as possible, as indicated in FIG. 2 by the placement of the gas injection system 236. However, in some embodiments, arrangement of portions of the system 100 within the working chamber may limit the proximity of the GIS 236 with respect to the planarizing area 258. The selection of the process gas may depend on the material to etch and the conductive traces forming the shadow masks. As such, it is desirable to select a gases or combination of gases that selectively or highly selectively etches the material over the conductive traces. In some embodiments, the material to etch, as previously noted, is a dielectric. However, in other embodiments, the material may be also be metal, but formed from a different metal than the conductive traces. For example, the conductive traces may be formed from copper whereas the material to etch may be aluminum or tungsten. To provide some examples, when selectively etching dielectrics such as $SiO_2$, $Si_3N_4$, and SiC, in the presence of copper or aluminum metal lines, various halogenated etchants (such as $XeF_2$, TFA, etc.) are preferred. When etching polymers, on the other hand, such as polyimide in the presence of metal, oxygen-containing precursors are preferred, such as $O_2$, water, $N_2O$, methyl nitroacetate, etc. Many other material combinations are possible, and each requires a carefully-chosen etchant to achieve selective removal.

In operation, the GIS 236 may provide a desired partial pressure of a process gas to the planarization area 258. The etching gas pressure during performance of the disclosed method, as measured by the main vacuum gauge in the lower chamber 116, for example, may conventionally be 1 to 2 $e^{-5}$ mbar, with normal background pressure of about 1 $e^{-6}$ mbar when the etch gas is not flowing into the chamber. In presence of the process gas, the ion beam 218 will be provided at a desired energy and pattern beam current density with the sample 202 oriented at a desired shallow angle $\Theta$. Conductive traces of the active area 202A (not shown, but see FIGS. 3 and 4) are oriented to be perpendicular to the incident direction of the ion beam 218 and may act as shadow masks to the ion beam 218. Acting as shadow masks, the conductive traces may limit or prevent ion milling of material (e.g., dielectric and/or metal) in areas separating the metal lines. Additionally, energetic ions of the ion beam 218 may interact with the process gas to induce etching of the material preferentially over the conductive traces. As such, the process gas used may be chosen to preferentially etch the material, whether it is a dielectric or metal, over the conductive traces. Moreover, the low pattern beam current density may also limit the amount of mechanical milling over the amount of chemical etching. In general, the amount of energy in the ion beam 218 may determine whether the resulting process is more etching-focused over milling focused, and the planarization technique disclosed herein may desirably fall within the bounds of the etch side of such relationship.

Figure 3A:
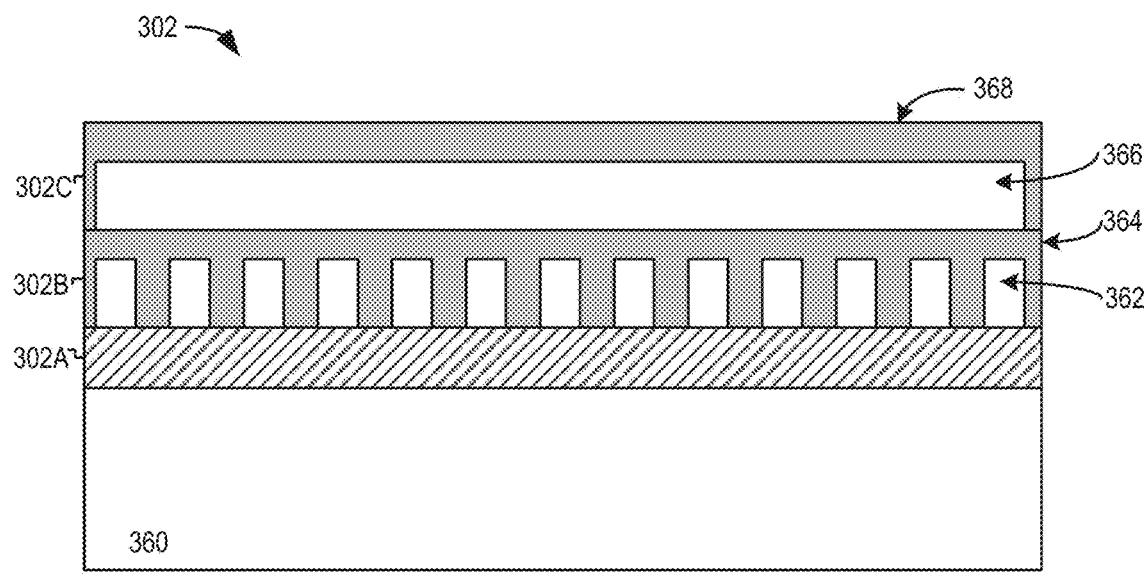
FIGS. 3A and 3B are illustrative side and plan views, respectively, of sample.
Figure 3B:
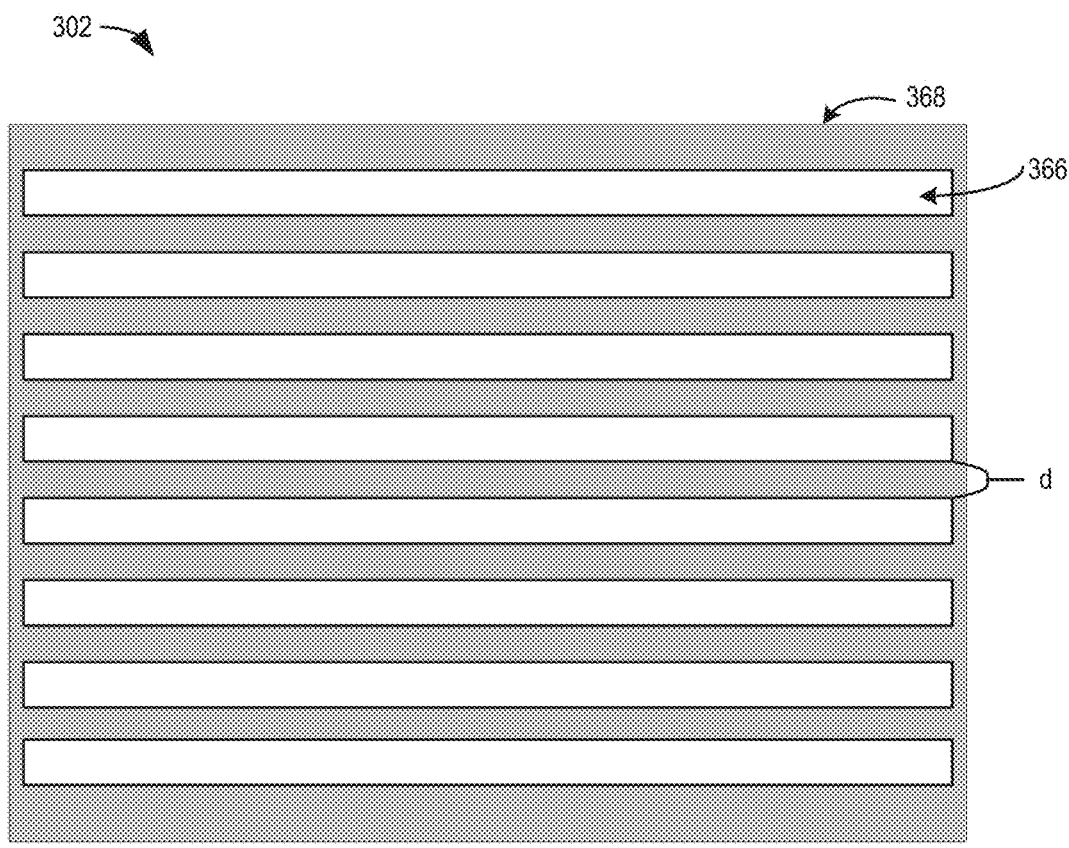

FIGS. 3A and 3B are illustrative side and plan views, respectively, of sample 302. The sample 302 may be an example of samples 102 and/or 202, and will be used to illustrate the planarization techniques disclosed herein. As such, the area of sample 302 may be a planarization area 358, which in itself may be a small area of a semiconductor wafer or an integrated circuit (IC). The sample 302 at least includes a substrate 360 with active layer 302A and a number of metal and via layers disposed thereon. Active layer 302A includes active circuitry, such as transistor structures, which may be interconnected using vias and interconnects of layers 302B and 302C. Conventionally, the size of the features, active circuitry and interconnects may increase in size from layer 302A to 302D, with the active circuitry being in the nanometer to 10's of nanometer range, and the interconnects of layers 302B and C being in the 100's of nanometers to micron range. While the sample 302 includes two metal layers, 302B, C, disposed on an active layer 302A, the number of metal layers of sample 302 is not limiting to the present disclosure and any number is contemplated herein, such as 1, 2, 3, 4, 5, 6 . . . 15.

In some embodiments, the substrate 360 may be formed from any semiconductor material, such as silicon, gallium arsenide, indium phosphide, gallium nitride, and the like. In other embodiments, the substrate 360 may be formed from non-semiconducting material, such as polymers, elastomers, metalloids, alloys, and the like. In embodiments where the substrate is a semiconductor material, the active layer 302A may include transistors, resistors, capacitors, inductors, etc., formed in or on the substrate 360. Additionally, the layers 302B, C may include one or more layers of conductive interconnects/traces coupling various electrical components of active layer 302A into functional circuitry, such as logic functions, drivers, and memory. The conductive interconnects within the layers 302B, C may be coupled through vias, and which may further be coupled to various active sites of layer 302A.

The layer 302B may include conductive interconnects 362 embedded in dielectric 364. The conductive interconnects 362 may be coupled at various locations to circuitry in the active layer 302A through vias. The conductive interconnects 362 may be formed from any metal or alloy, and may include copper, aluminum, silver, gold, tungsten, titanium, chromium, and combinations thereof to name a few. Similarly, the dielectric 364 may be formed from any insulative material, such as silicon oxide, silicon dioxide, silicon nitride, silicon carbide, polyimide and combinations thereof. The layer 302C may be similar to layer 302B and include conductive interconnects 366 embedded in dielectric 368. While the interconnects and dielectrics of layers 302B and 302C may be the same in some embodiments, such similarity is not required and not limiting.

As shown in FIGS. 3A and 3B, the conductive interconnects 362, 366 may be formed in long parallel lines, or characterized as such at least within the bounds of the planarization area 358. Further, the conductive interconnects of one active layer, 362 for example, may be formed perpendicular to a direction of the other layer, 366 for example. However, while such an example is depicted in FIGS. 3A, 3B, such an arrangement may not be required or even that way across an entire IC or wafer.

FIGS. 4A through 4E are illustrative side views of the sample 302 at various stages of a planarization technique in accordance with an embodiment of the present disclosure. The illustrations in FIG. 4 show the sample 302 after having one or more processing steps implemented, such as by system 100 for example. The processing steps may include a planarization process, a spin milling process, and various other steps for removing layers 302C and B while leaving an exposed area of 302A planar.

Figure 4A:
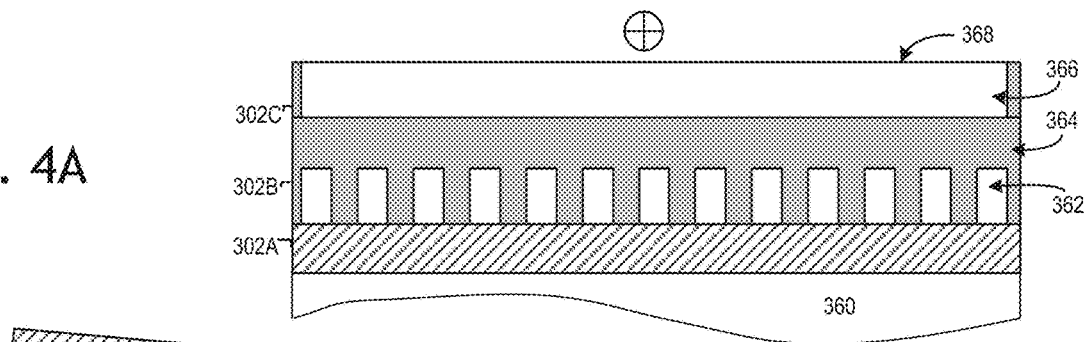
FIGS. 4A through 4E are illustrative side views of the sample at various stages of a planarization technique in accordance with an embodiment of the present disclosure.

FIG. 4A shows the sample 302 after having the upper most portions of dielectric 368 removed at least down to being flush with the top surface of conductive interconnects 366. The top surface of the conductive interconnects 366 may now be exposed. The removal of the top portion of dielectric layer 368 may include spin milling for bulk removal followed by a planarization step as disclosed herein. The spin milling step may include exposing the surface of dielectric 368 to an ion beam while rotating sample 302. The spin milling may be performed at a normal or almost normal incident angle to the dielectric layer 368, and may include gas assisted etching, but the gas assisted etching is optional.

The planarization process will include orienting the sample 302 to the ion beam as shown in FIG. 2, for example, and further includes arranging the sample so that the conductive traces 366 are arranged perpendicular to the incident ion beam and so that the angle Θ formed between the surface and the ion beam is shallow, e.g., 1° to 20°. The incident beam is incident into the plane of the page, for reference, as noted by the circle with the cross. The angle of Θ may be dependent upon a distance d that separates the conductive traces 366. (See FIG. 3B for an example of distance d.) For example, a larger distance d may require a shallower angle, e.g., 2.5°, compared to a shorter distance d. In addition to the orientation of the sample 302, a process gas may be provided to the surface through GIS 236, for example. The process gas provided to the surface may depend on the material makeup of dielectric 368, and may be chosen to preferentially etch the dielectric material 368 over the material forming the conductive traces 366. For example, if the conductive traces are formed from copper and the dielectric 368 is silicon oxide, then the process gas may be xenon difluoride, which preferentially etches the dielectric over the copper. With the process gas provided to the surface, the ion beam may be provided at a desired energy and beam current. The energy and beam current may be selected to induce etching of the dielectric 368 material over initiating ion milling by the ion beam. While ion milling at some level may always be present, the combination of the shallow angle and the normal orientation of the conductive traces 366 may further reduce the incidence of ion milling due to the conductive traces forming a shadow mask to the ion beam. During planarization, the ion beam may be quickly rastered over the surface of sample 302 being planarized such that etching is initiated before the ion beam is moved to a subsequent location. For example, the dwell time at each stop of the rastering may be in the range of 25 to 300 nanoseconds. The flow of the process gas and the rastering of the ion beam may continue until a top surface of the conductive traces 366 is exposed. At this point, the exposed surface of the sample 302 may be planar, at least with respect to the conductive traces 366. It should be noted that material from dielectric 368 will remain in the gaps between conductive traces 366 and may be flush or just under the top surface of the conductive traces 366 (see FIG. 4C).

Figure 4B:
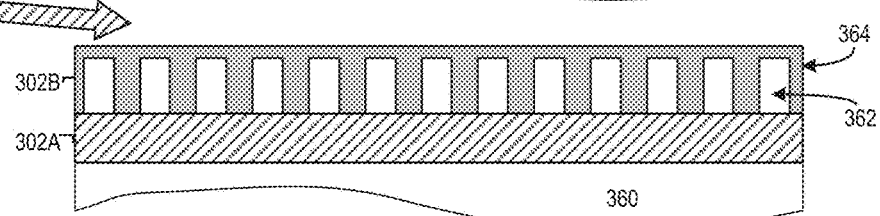

FIG. 4B shows the sample 302 after spin milling has been performed down into dielectric layer 364. The spin milling process may remove the remainder of dielectric 368, conductive traces 366 and a top portion of dielectric 364. The spin milling may be stopped before the conductive traces 362 are uncovered so that a relatively thin layer of dielectric 364 remains. Leaving the thin layer of dielectric 364 over conductive traces 362 allows for performing a subsequent planarization process with chemically-selective etching. Since the conductive traces 362 are extending into the page, the ion beam can be incident from the left, as shown, so that the conductive traces 362 are arranged perpendicular to the incoming direction of the ion beam, as noted by the arrow.

Figure 4C:
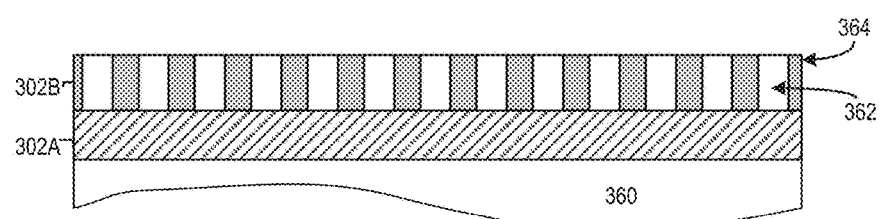

FIG. 4C shows the sample 302 after a second planarization process is performed to planarize down to the top surface of the conductive traces 362. As such, the dielectric 364 may be etched using the planarization techniques disclosed herein so that the exposed surface is flush with the top level of the conductive traces 362.

Figure 4D:
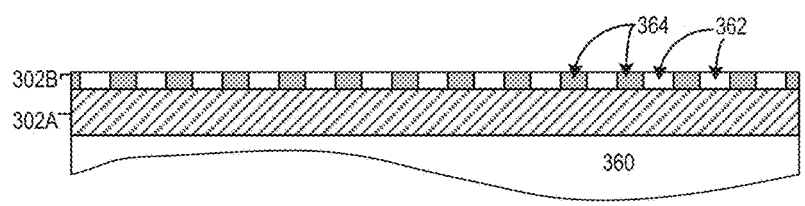
Figure 4E:
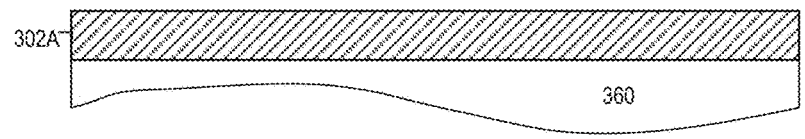

FIG. 4D shows the sample 302 after a subsequent spin milling process is performed to remove a large portion of dielectric 364 and conductive traces 362, which is followed by another planarization process to remove the reminder of those two materials, as shown in FIG. 4E. The last planarization process may expose the active layer 302B, which may be removed with the current planarization process or other process to eventually expose active circuitry of the sample 302.

FIGS. 5A through 5D are example illustrations of a milling and etching process 501 for planarizing a sample in accordance with an embodiment of the present disclosure. The process 501 may be implemented in a charged particle beam system, such a system 100, and may include both milling and selectively etching various materials of a sample 502. The process 501 includes removing material using a first set of parameters and a process gas, and planarizing using a second set of parameters and process gas. The first set of parameters may remove material more indiscriminately than the second set of parameters. As such, imaging the sample 502 while removing material with the first set of parameters may be necessary to receive feedback regarding when to stop material removal.

Figure 5A:
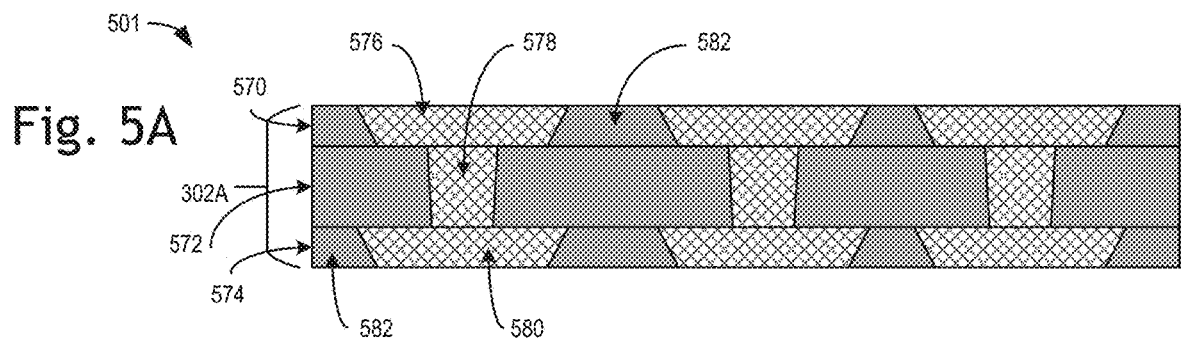
FIGS. 5A through 5D are example illustrations of a milling and etching process 501 for planarizing a sample in accordance with an embodiment of the present disclosure.

FIG. 5A is an example sample 502 that includes an active layer 502. For the sample 502, only two metal layers 570 and 574 are shown, and which are separated by a via layer 572. The metal layers 570, 574 include metal interconnects, e.g., lines, 576 and 580, respectively, while via layer 572 includes metal via 578. The other material in layers 570-574 is dielectric 582. In some embodiments, the metal interconnects 576, 580 can be formed from copper, but other metals, such as aluminum and silver, are also contemplated herein. The dielectric 582 may be formed from silicon oxide, silicon nitride, polyimide, etc., and the material forming the dielectric 582 may determine a process gas to use in the second set of parameters. Subsequent layers that include active circuitry are not shown, and neither is the substrate. The omitted layers, however, would be included and are omitted for sake of clarity.

Figure 5B:
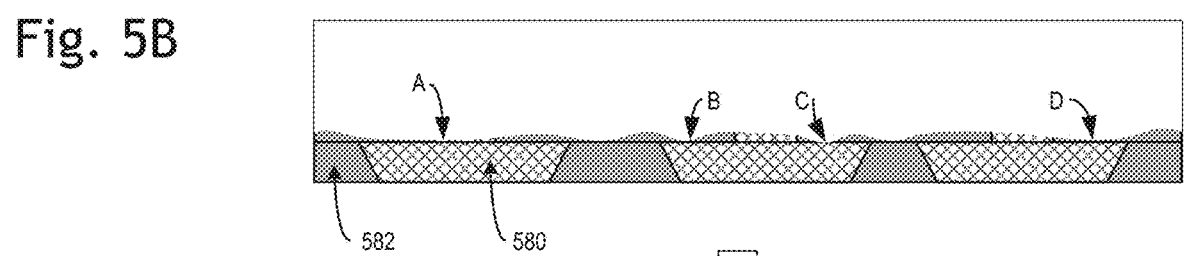

FIG. 5B shows the sample 502 after removal of the first metal layer 570 and most of via layer 572. These layers may be etched using a different process than the planarization process disclosed herein, which may include orienting the sample 502 normal to an ion source, providing an etchant gas, and an ion beam at energies dependent upon the thickness of the metal layers being removed. The beam current may be 1 to 10 pA/μm$^2$ at beam energies of 5 keV to 30 keV, and the etchant gas being a methyl nitroacetate or related compound. However, as shown in FIG. 5B, the removal of material is stopped once metal 580 of metal layer 574 is exposed. For example, metal 580 is exposed at positions A, B, C, and D. While material removal may stop when only small areas of the metal are exposed, a thin layer of dielectric 582 may remain over most of metal 580. However, the system performing the material removal may switch to the second set of parameters at this point to selectively remove the remaining dielectric 582 to planarize the sample 502 to the top level of metal 580 of layer 574.

The planarization step includes selectively etching the remaining dielectric 582 using a selective etch gas and low energy charged particle beam, e.g., 2-5 Kev. Reducing the energy of the beam reduces sputtering of the metals and dielectric and accentuates the etching of the dielectric 582. The process gas, as noted, may depend on the material forming the dielectric 582.

Figure 5C:
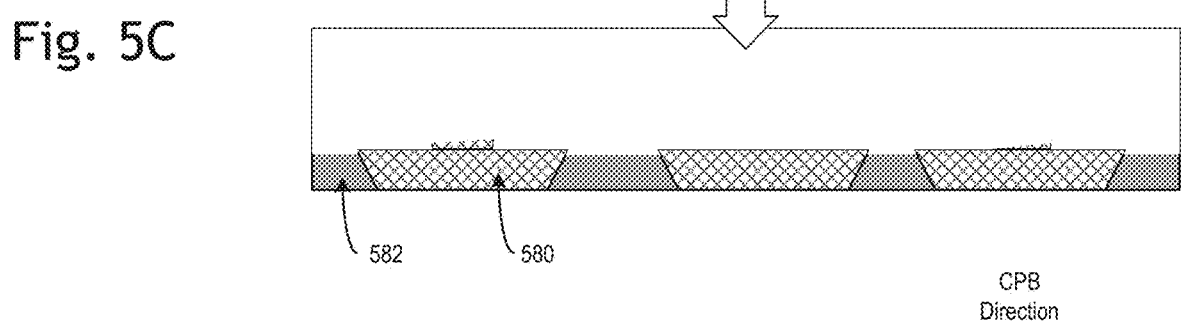

FIG. 5C illustrates the selective removal of some of the dielectric 582 to planarize the sample 502 to the top surface of metal 580. The example of FIG. 5C shows the selective etching with the charged particle beam (CPB) at a normal incidence angle to the sample 502. As can be seen, the dielectric 582 may be evenly removed to a level slightly below the top surface of metal 580. While the dimensions in the illustration are exaggerated, the sample 504 may be considered planar, at least with respect to the top level of metal 580.

Figure 5D:
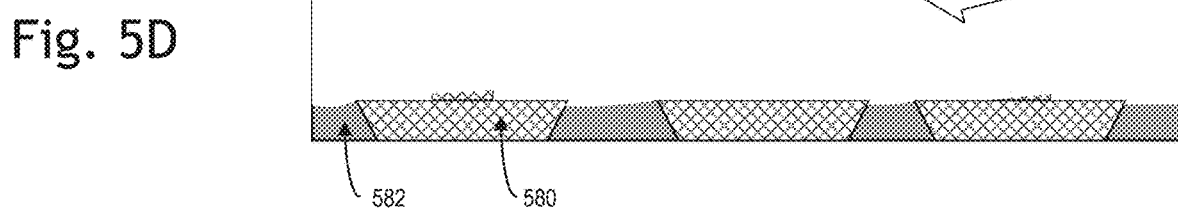

FIG. 5D, on the other hand, illustrates the planarized sample 502 using the CPB at an angle to the sample 502. As can be seen, the areas of the dielectric 582 directly to the left of metal lines 580 is closer to the top surface of the metal lines than the dielectric closer to the right of the metal lines. Etching the dielectric 582 with the CPB at an angle causes the metal lines 580 to act as shadow masks to the CPB, which reduces milling of the dielectric 582 in areas in the shadow of the metal lines 580. Additionally, the planarizing step using an angled CPB, which may be at a glancing angle, may be performed from two opposing directions to reduce the amount of dielectric 582 being removed from between the metal lines 580.

Figure 6:
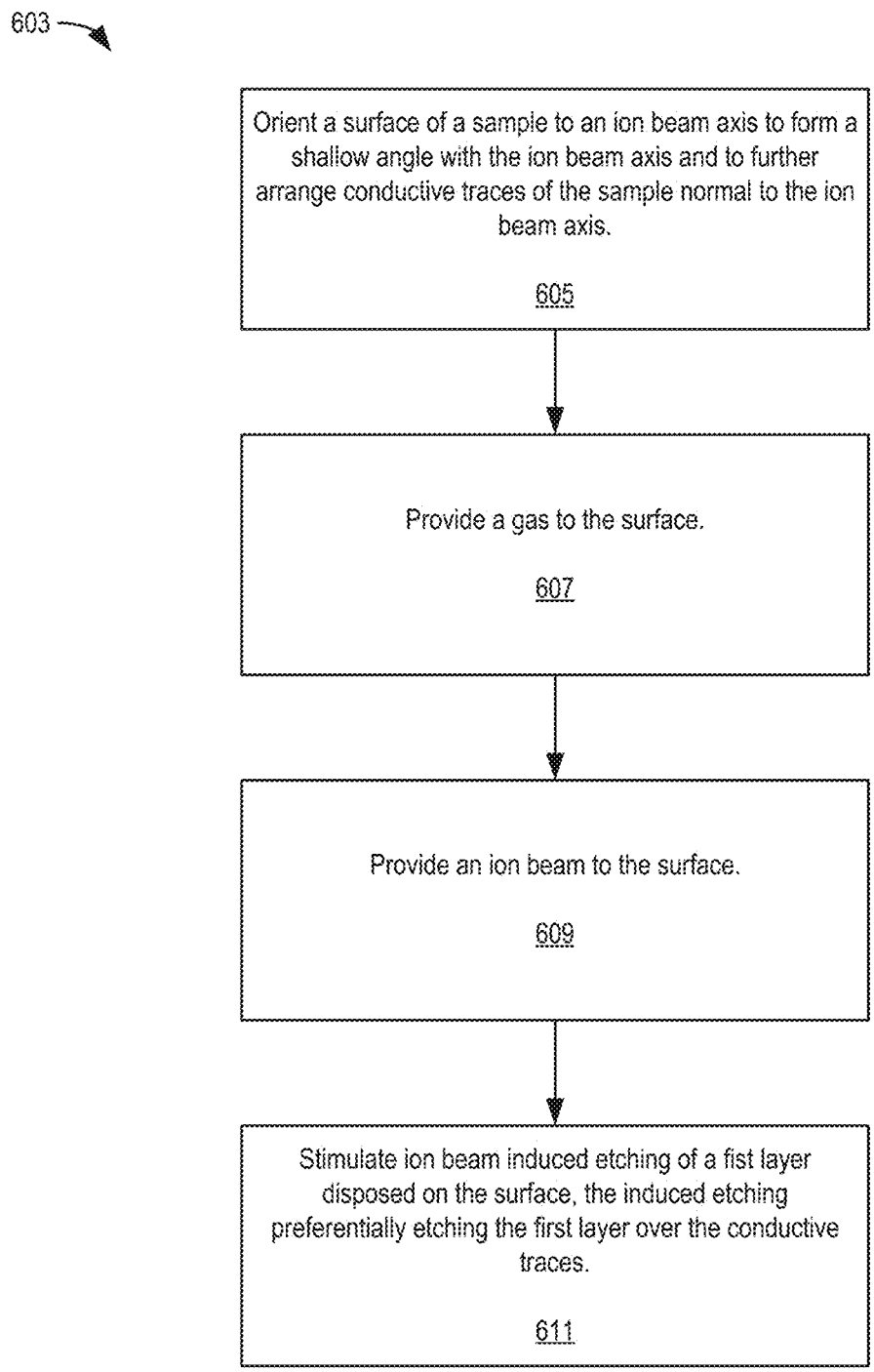
FIG. 6 is an example planarization method in accordance with an embodiment of the present disclosure.

FIG. 6 is an example planarization method 603 in accordance with an embodiment of the present disclosure. The method 603 may be implemented in a charged particle system, such as system 100, and may be used to planarize samples as shown in the example of FIG. 4. Once a sample is loaded into an example system 100, the method 603 may begin at process block 605, which includes orienting a surface of a sample to an ion beam axis to form a shallow angle between the ion beam axis and the surface of the sample. Additionally, the sample may be arranged so that conductive traces that extend across its surface or disposed in an upper layer are normal to the ion beam axis. Orienting the sample to form the shallow angle and arranging the conductive traces normal to the ion beam axis may allow the conductive traces to act as shadow masks to the ion beam, which may prevent the ion beam from directly impinging a first layer disposed between the conductive traces thereby reducing direct milling and promoting etching.

Process block 605 may be followed by process block 607, which includes providing a gas to the surface of the sample. The gas may be provided by a GIS, such as the GIS 136 and/or 236. Once the gas has been provided to the surface of the sample, process block 609 may follow, which includes providing an ion beam to the surface of the sample. The ion beam provided by an ion column, such as ion column 256.

The process block 609 may be followed by process block 611, which includes stimulating ion beam induced etching of a first layer disposed on the surface of the sample. In some embodiments, the induced etching will preferentially etch the first layer over conductive traces disposed therein. Additionally, the ion beam may be rastered over the surface to selectively etch the first layer over a desired planarization area. Moreover, the orientation of the sample and the arrangement of the conductive traces with respect to the ion beam allows for planarization of the sample surface level with a top surface of the conductive traces. As noted, the conductive traces provide a shadow mask to the ion beam to prevent or reduce ion milling of the first layer so that selective etching of the first layer occurs.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

What is claimed is:

1. A method comprising;
   orienting a surface of a sample to a charged particle beam axis, the sample including a first layer, the first layer formed from first and second materials, the first material different than the second material and patterned into a plurality of parallel lines that are disposed in the second material, wherein a top surface of the second material forms the surface, and wherein the surface is oriented to form a shallow angle with the charged particle beam axis and to arrange the plurality of parallel lines so that a long side of the plurality of parallel lines extends across the charged particle beam axis;
   providing a charged particle beam along the charged particle beam axis toward the surface of the sample, the charged particle beam provided at a pattern beam current density in a range from 0.1 pA/um$^2$ to 50 pA/um$^2$;
   providing a gas to the surface of the sample; and
   selectively etching, with ion induced chemical etching, the second material at least down to a top surface of the first material, the charged particle induced etching stimulated due to concurrent presence of the charged particle beam and the gas over the surface of the sample.

2. The method of claim 1, wherein the plurality of parallel lines forms a shadow mask to the charged particle beam.

3. The method of claim 1, wherein a distance between adjacent parallel lines of the plurality of parallel lines determines a degree of the shallow angle.

4. The method of claim 3, wherein the degree ranges from 1 degree to 38 degrees, the shallow angle measured from the charged particle beam axis and the surface of the sample.

5. The method of claim 3, wherein the degree of the shallow angle is inversely related to the distance between adjacent parallel lines of the plurality of parallel lines.

6. The method of claim 1, wherein providing a charged particle beam includes providing the charged particle beam at a low energy.

7. The method of claim 6, wherein the low energy includes providing the charged particle beam at a voltage in a range of 0.5 KeV to 30 Kev.

8. The method of claim 1, wherein the pattern beam density is in a range of 0.1 pA/um$^2$ to 1 pA/um$^2$.

9. The method of claim 1, wherein the gas is an etchant gas.

10. The method of claim 9, wherein the etchant gas is selected from one of Xenon difluoride, chlorine, iodine, bromine, nitrous oxide, oxygen, water, fluorine, trifluoroacetate acid, trifluoroacetamide, methyl nitro acetate, and acetic anhydride, and combinations thereof.

11. The method of claim 9, wherein the etchant gas preferentially etches the second material over the first material.

12. The method of claim 1, wherein the second material is a dielectric.

13. The method of claim 12, wherein the dielectric is one of silicon oxide, silicon dioxide, silicon nitride, silicon carbide, polyimide and combinations thereof.

14. The method of claim 1, wherein the first material is metal.

15. The method of claim 1, wherein the sample is a semiconductor chip.

16. The method of claim 1, wherein the sample is a transmission electron microscope (TEM) lamella.

17. The method of claim 1, wherein a dwell time of the charged particle beam at locations on the surface is short.

18. The method of claim 16, wherein the dwell time is in a range of 25 to 300 nanoseconds.

19. The method of claim 1, wherein the sample surface is planarized due to charged particle beam induced selective etching of the second material over the first material, and further based on the plurality of parallel lines providing a shadow mask to the ion beam.

20. The method of claim 1, further comprising:
spin milling a remainder of the first layer and a portion of a second layer disposed under the first layer, the remainder of the first layer including the first and second materials; and
planarizing the second layer down to a top surface of metal lines of the second layer, the second layer including third and fourth materials, wherein planarizing the third surface comprises:
orienting an exposed surface of the sample to the ion beam axis to form the shallow angle with the ion beam axis and to arrange metal lines formed of the fourth material normal to the ion beam axis;
providing the gas to the exposed surface of the sample;
providing the ion beam to the exposed surface at a low energy and at a low pattern beam density; and
based on the presence of the gas and the ion beam, stimulating ion beam induced etching of the third material.

\* \* \* \* \*